United States Patent [19]

Watanabe

[11] Patent Number: 4,768,168

[45] Date of Patent: Aug. 30, 1988

[54] MEMORY CIRCUIT HAVING AN IMPROVED WRITING SCHEME

[75] Inventor: Takayuki Watanabe, Tokyo, Japan

[73] Assignee: NEC Corporation, Tokyo, Japan

[21] Appl. No.: 840,827

[22] Filed: Mar. 18, 1986

[30] Foreign Application Priority Data

Mar. 18, 1985 [JP] Japan ................................. 60-53662

[51] Int. Cl.[4] .................... G11C 11/00; G11C 7/00; G11C 8/00
[52] U.S. Cl. .................................. 365/189; 365/154; 365/191; 365/230
[58] Field of Search ............... 365/149, 154, 189, 230, 365/208, 210, 191, 233

[56] References Cited

U.S. PATENT DOCUMENTS

| | | | |
|---|---|---|---|
| 4,272,834 | 6/1981 | Noguchi et al. ..................... | 365/189 |
| 4,507,759 | 3/1985 | Yasui et al. ......................... | 365/189 |
| 4,592,022 | 5/1986 | Shimohigashi et al. ............ | 365/189 |
| 4,651,306 | 5/1987 | Yanagisawa ........................ | 365/189 |
| 4,658,377 | 4/1987 | McElroy ............................. | 365/230 |

*Primary Examiner*—Terrell W. Fears
*Assistant Examiner*—Melissa J. Koval
*Attorney, Agent, or Firm*—Sughrue, Mion, Zinn, Macpeak & Seas

[57] ABSTRACT

An improved memory circuit having a fast write speed is disclosed. A first control signal is generated when a first period of time has elapsed from the initiation of an access cycle, in a fixed timing both in a read operation and a write operation. A second control signal for enabling a data input circuit when a second shorter period has elapsed from the initiation of the access cycle only in a write operation. A data transfer between a selected bit line and a bus line is performed when at least one of the first and second control signals.

7 Claims, 4 Drawing Sheets

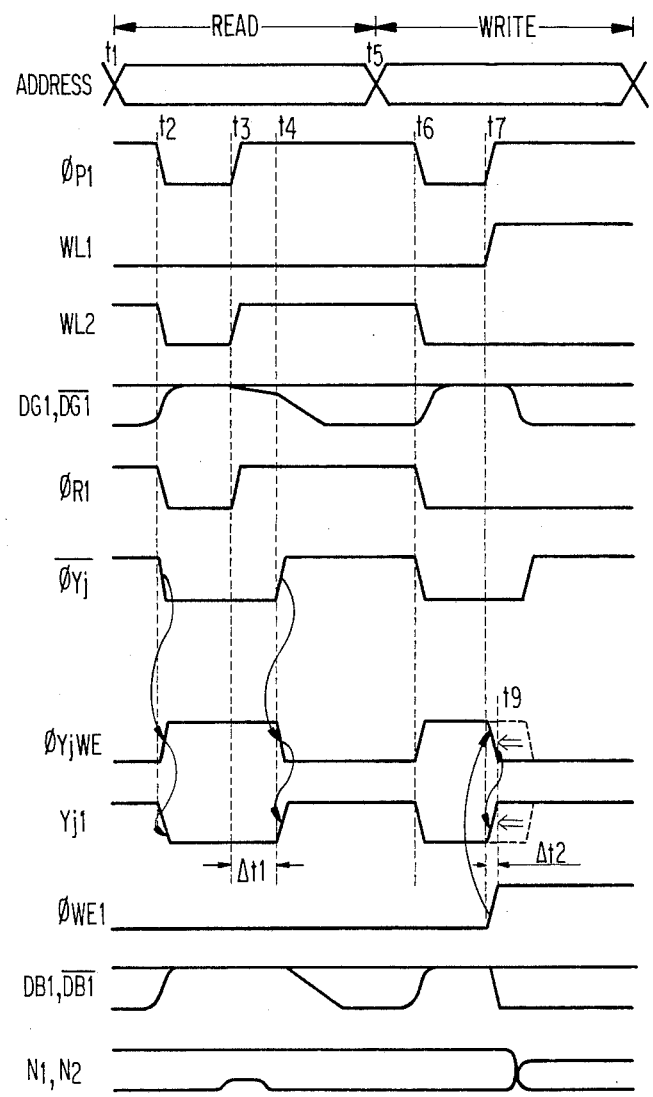

MEMORY CIRCUIT HAVING AN IMPROVED WRITING SCHEME

BACKGROUND OF THE INVENTION

The present invention relates to a memory circuit, and particularly to a static type random access memory (SRAM) comprised of MOS field effect transistors (MOSFETs).

SRAMs have been widely utilized in various fields as high speed RAMs. In view of savings of external terminals, a so-called internal-synchronous SRAM has been proposed and presently subjected to practical use. In the internal-synchronous SRAM, when a change in address inputs occurs for a new access cycle, at least one control signal is generated within a SRAM and the new access cycle is initiated under control of the above at least one control signal.

For example, in the case of a read operation, after content of the address inputs has changed, a precharge signal is first generated so that each pair of bit lines are precharged. A predetermined time after, a row control signal is generated and therefore, one of word lines is selected. Then, read signals on each pair of bit lines are amplified by a sense amplifier. After the read signals on a pair of bit lines are amplified and distinguished into binary logic levels, a column enable signal is generated and a selected pair of bit lines are connected to a pair of bus lines. Then, data on the bus lines is outputted by an output circuit.

In the case of a write, the precharge of bit lines, the selection of word lines are sequentially conducted as in the case of a reading operation. While in this case, a write control signal is activated at the same time as the selection of the word lines so that an input buffer is enabled. The input buffer circuit generates the input data on the pair of bus lines after a relatively short time has elapsed from the enable of the input buffer. However, the selective connection of a pair of bit lines to the pair of bus lines is conducted after a relatively large time has elapsed from the selection of word lines as in the case of the read operation. Namely, the timing relation from the change in address inputs to the selection of bit lines in the write operation is fixed in the same manner as in the read operation. Therefore, even the input data is established on the pair of bus lines at a relatively early stage of the write cycle, writing of the input data to the selected pair of bit lines must be delayed until the time when the selection of bit lines is achieved. Thus, a fast write operation cannot be expected in the conventional SRAMs.

SUMMARY OF THE INVENTION

It is an object of the present invention to provide an SRAM having a fast writing function.

The memory circuit according to the present invention is of the type having a plurality of word lines, a plurality of bit lines, a plurality of memory cells coupled to the word lines and the bit lines, a bus line, a bit line selection circuit for performing data transfer between the selected bit line and the bus line, and an input data buffer for operatively supplying the bus line with input data, the bit line selection circuit being enabled by a first control signal which is generated when a first time period has elapsed from the initiation of an access cycle, the input buffer circuit being enabled by a second control signal which is generated when a second time period has elapsed from the initiation of the access cycle in a write mode, the second period being shorter than the first period, and is featured in that the bit line selection circuit is adapted to be enabled in response to either one of the first and second control signals in a write mode.

According to the present invention, the bit line selection circuit is enabled by the second control circuit at an earlier time than the enabling of the bit line selection circuit by the first control signal. Accordingly, a fast write operation can be conducted.

BRIEF DESCRIPTION OF THE DRAWINGS

FIG. 4 is a timing chart for explaining operations of the SRAM of FIG. 3.

DETAILED DESCRIPTION OF THE INVENTION

Figure 1:
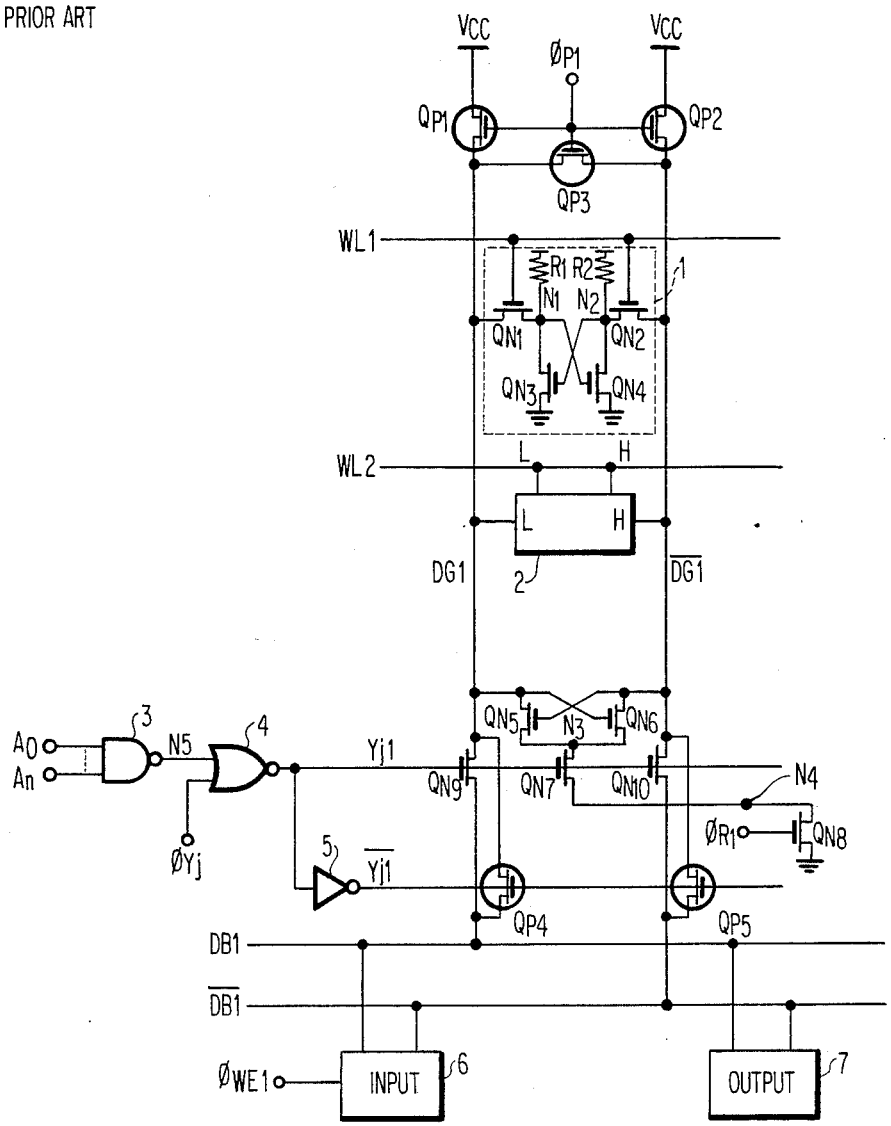
FIG. 1 is a schematic circuit diagram showing an SRAM according to a prior art.

Referring to FIG. 1, a conventional SRAM is explained. P-channel field effect transistors $Q_{P1}$ to $Q_{P3}$ form a bit line precharge circuit for precharging a pair of bit lines DG1 and $\overline{DG1}$ in response to a low level of a precharge control signal $\phi_{P1}$. A memory cell 1 connected to the pair of bit lines DG1 and $\overline{DG1}$ and a word line $WL_1$. The memory cell 1 is composed of N-channel field effect transistors $Q_{N1}$ to $Q_{N4}$ and load resistors $R_1$ and $R_2$. Other memory cells such as 2 have the same configuration. N-channel field effect transistors $Q_{N5}$ to $Q_{N7}$ form a sense amplifier for the pair of bit lines DG and $\overline{DG}$. A common node $N_4$ is connected to the sources of the transistors $Q_{N7}$ of the respective sense amplifiers. A sense enable transistor $Q_{N8}$ of N-channel is connected between the node $N_4$ and a ground potential. The transistor $Q_{N8}$ enables the selected sense amplifier in response to a high ($V_{cc}$) level of a sense enable signal $\phi_{R1}$. The bit line DG1 is connected through a parallel circuit of an N-channel transistor $Q_{N9}$ and a P-channel transistor $Q_{P4}$ to a bus line $\overline{DB1}$, while the bit line DG1 is connected to a bus line $\overline{DB1}$ via a parallel circuit of an N-channel transistor $Q_{N10}$ and P-channel transistor $Q_{P5}$. A NAND gate 3 receiving address input signals $A_0$ to $A_n$ serves as a column address decoder, and a NOR gate 4 receiving the output $N_5$ of the gate 3 and a column enable signal $\phi_{Yi}$ for operatively performing a column selection by way of its output $Y_{j1}$ and its inverted output $\overline{Y_{j1}}$ via an inverter 5. An output circuit 7 is connected to the but lines DB1 and $\overline{DB1}$. The output circuit 7 generates an output signal at an output terminal OUT. An input circuit 6 coupled to the bus lines DB1 and $\overline{DB1}$ applies an input data at an input terminal IN to the bus lines DB1 and $\overline{DB1}$ in response to a write enable signal $\phi_{WE1}$.

Figure 2:
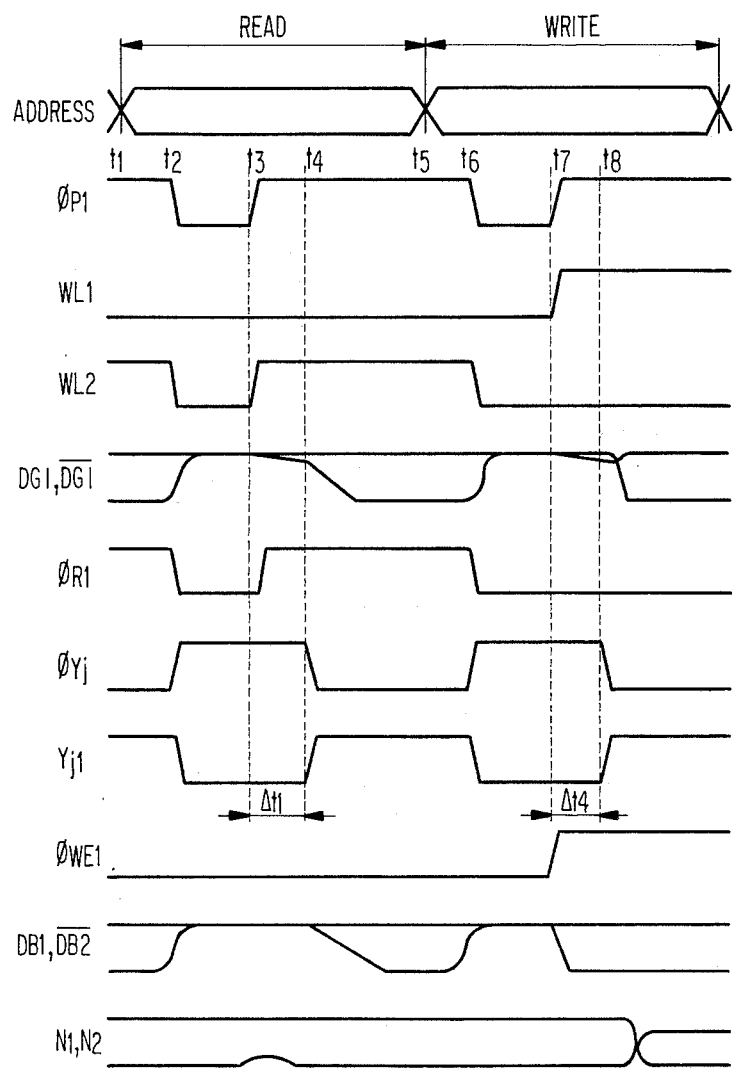
FIG. 2 is a timing chart for explaining operations of the SRAM of FIG. 1.

Referring to FIG. 2, read operation and write operation of the memory of FIG. 1 are explained.

First, the read operation is explained. At a time point $t_1$, at least one address input signal is changed and a new access cycle is initiated. In response to this change, the precharge control signal $\phi_{P1}$ falls in level between time points $t_2$ and $t_3$ so that the pair of bit lines DG1 and $\overline{DG1}$ are precharged during this period ($t_2$–$t_3$). At the time point $t_3$, one of the word lines e,g, WL2 is selected. Therefore, the levels of the pair of bit lines DG1 and $\overline{DG1}$ start to change according to memory contend of the selected memory cell. When the levels of the bit lines DG1 and $\overline{DG1}$ are determined by the selected memory cell at a time point $t_4$, the column enable signal $\phi_{Yj}$ falls in level thereby to determine the state of the column selection signals $Y_{j1}$ and $\overline{Y_{j1}}$. If the column of DG1, $\overline{DG1}$ is selected by "1" level of $Y_{j1}$ and "0" level of $\overline{Y_{j1}}$, the sense amplifier provided for this column (DG1, $\overline{DG1}$) is enabled to enlarge the potential difference between the bit lines DG1 and $\overline{DG1}$. In this instance, the pair of bus lines DB1 and $\overline{DB1}$ are connected to the selected bit lines DG1 and $\overline{DG1}$, and hence the potentials on the bus lines DB1 and $\overline{DB1}$ are also amplified by the sense amplifier. The amplified signals on the bus lines are inputted to the output circuit 7 for a readout signal. In this read operation, in order to ensure that the potentials of the bit lines DG1 and $\overline{DG1}$ are determined by the selected memory cell, a certain period $\Delta_{t1}$ is provided between $t_3$ and $t_4$.

Subsequently, a write operation is explained. At a time point $t_5$, the content of the address input signals has changed thereby to terminate the previous access cycle and initiate new access cycle. In response to this change, a low level of the precharge control signal $\phi_{R1}$ is generated between $t_6$ and $t_7$. At $t_7$, the selected word line, e.g. WL1 is raised in potential and the write control signal $\phi_{WE1}$ is raised to enable the input circuit 6. Then, the potentials of the pair of bus lines DB1 and $\overline{DB1}$ are changed by the input circuit 6. However, since the column enable signal $\phi_{Yj}$ is not fallen in level in this instance, and therefore, the potentials on the bus lines DB1 and $\overline{DB1}$ are not transferred to the selected pair of bit lines DG1 and $\overline{DG1}$.

In this write operation, the sense amplifier is not enabled. When a certain period $\Delta_{t4}$ which is equivalent to $\Delta_{t1}$, has elapsed from $t_3$ at $t_8$, the $\phi_{Yj}$ is fallen so that the column signal $Y_{j1}$ is selected. Accordingly, the bit lines DG1 and $\overline{DG1}$ are connected to DB1 and $\overline{DB1}$ via transistor $Q_{N9}$ and $Q_{P4}$, and $Q_{N10}$ and $Q_{P5}$, respectively. As a result, the input data is transmitted to the selected bit lines DG1 and $\overline{DG1}$, achieving the write operation.

According to this technique, even when the potentials on the bus lines DB1 and $\overline{DB1}$ are determined by the input data, writing of the levels of DB1 and $\overline{DB1}$ must be waited until $t_8$ when the column selection is conducted in response to the low level of $\phi_{Yj}$. Accordingly, a writing speed is limited to a relatively small value.

Figure 3:
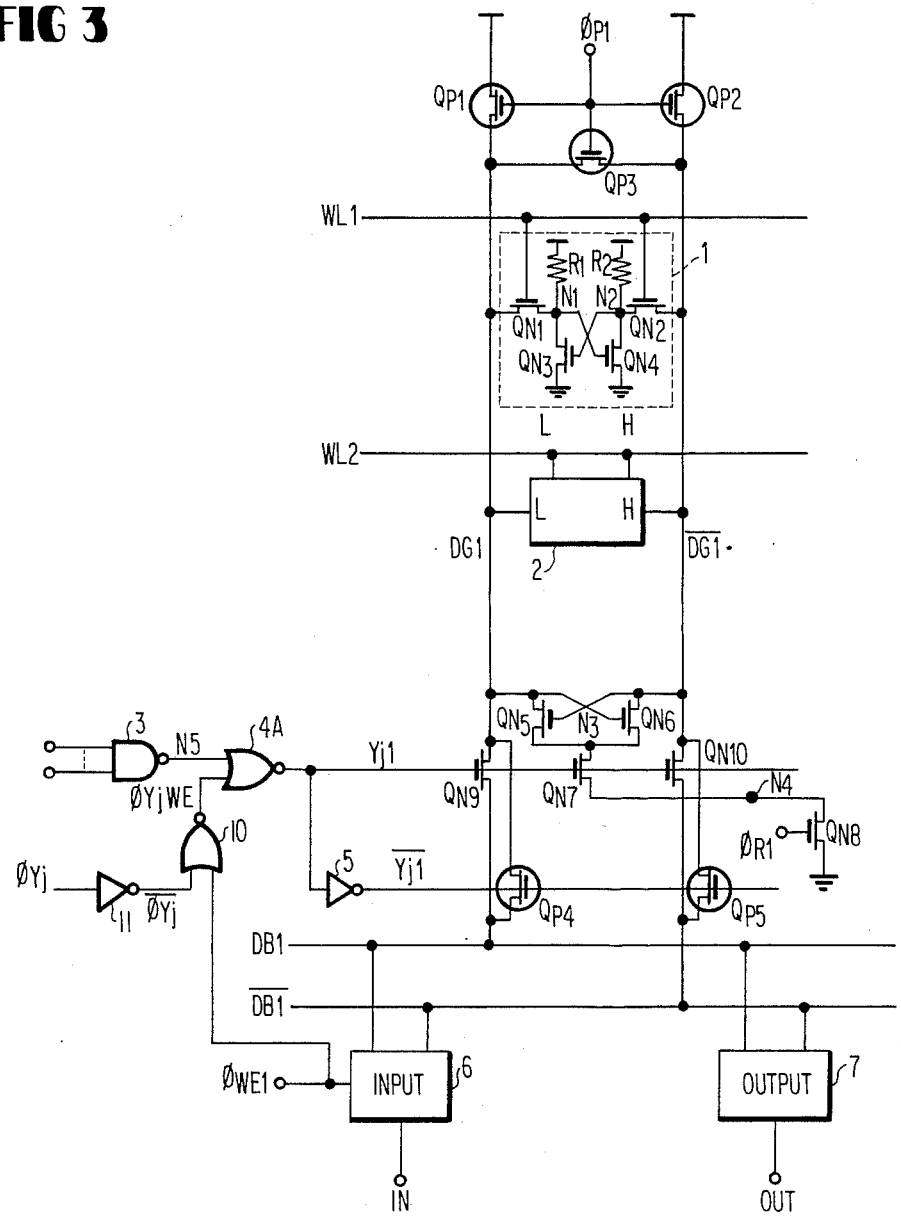
FIG. 3 is a schematic circuit diagram showing the SRAM according to an embodiment of the present invention.

Referring to FIG. 3, a memory according to one embodiment of the invention is explained.

In FIG. 3, portions corresponding to those in FIG. 1 are designated by the same references. This embodiment newly comprises an inverter 11 receiving the column enable signal $\phi_{Yj}$, identical to $\phi_{Yj}$ in FIG. 1, to generate an inverted signal $\overline{\phi_{Yj}}$ and a NOR gate 10 receiving $\overline{\phi_{Yj}}$ and the write control signal $\phi$hd WE1. An output $\phi_{YjWE}$ of the NOR gate 10 is inputted to the NOR gate 4 in place of $\phi_{Yj}$ in FIG. 1. According to this arrangement, upon a read operation the write control signal $\phi_{WE1}$ is at a low level and hence the signal $\phi_{YjWE}$ assumes the same level as the signal $\phi_{Yj}$. Therefore, a read operation is conducted in the same manner as in the circuit of FIG. 1. In a write operation, even when the signal $\phi_{Yj}$ is still high, the signal $\phi_{YjWE}$ is changed in synchronism with the write control signal $\phi_{WE1}$. Therefore, when the $\alpha_{WE1}$ is at a high ($V_{cc}$) level, the signal $\alpha_{jWE}$ is at a low level so that the output N5 of the decoder 3 determines the state of $Y_{j1}$ and $\overline{Y_{j1}}$ via the NOR gate 4. Accordingly, the signals on the pair of bus lines DB1 and $\overline{DB1}$ are transferred to the pair of bit lines DG1 and $\overline{DG1}$ as soon as they appear on DB1 and $\overline{DB1}$ according to the invention. As a result, a fast write operation can be achieved.

Referring to FIG. 4, the read and write operations of the memory of FIG. 3 are explained. In a read operation during a period from $t_1$ to $t_5$, the write control signal $\phi_{WE1}$ is kept low throughout the whole cycle. Therefore, the signal $\phi_{YjWE}$ is the same as the signal $\phi_{Yj}$ in FIG. 1. Accordingly, the read operation is conducted in the same way as in the read operation in FIG. 2 and $\Delta_{t1}$ between the time points $t_3$ and $t_4$ is also the same in FIG. 2.

In a write operation, the content of the address input signals is changed at $t_5$. In response to this change, the low level of the precharge control signal $\phi_{P1}$ is generated during a period of $t_6$ to $t_7$ so that the bit lines are precharged. While at $t_7$, the selection of word line (e.g. WL2) is made and the write control signal $\phi_{WE1}$ is raised to the high ($V_{cc}$) level. In response to the rise of $\phi_{WE1}$, the input buffer 6 produces true and complementary input signals on the bus lines DB1 and $\overline{DB1}$. While in response to the rise of $\phi_{WE1}$, the output $\phi_{YjWE}$ of the NOR gate 10 is changed to a low level even when the $\phi_{Yj}$ is still high in level. Accordingly, the states of $Y_{j1}$ and $\overline{Y_{j1}}$ are changed by the NOR gate 4 in response to the output N5 of the decoder 3 to the respective levels to turn the transistor pairs $Q_{N9}$, $Q_{P4}$ and $Q_{N10}$, $Q_{P5}$ ON in the case where the output N5 is at a low level, at a time point $t_9$ after a negligibly small delay $\Delta_{t2}$ ($\Delta_{t2} << \Delta_{t1}$) from $t_7$. At $t_9$, the true and complementary input signals on the bus lines DB1 and $\overline{DB1}$ are transmitted to the selected bit lines DG1 and $\overline{DG1}$.

Accordingly, the write signals on the bus lines can be written at the early stage in the write cycle.

I claim:

1. A memory circuit comprising a plurality of word lines, a plurality pairs of bit lines, a plurality of static memory cells each coupled to one of the word lines and a pair of bit lines, a pair of bus lines, a plurality of pairs of transfer gates, each pair of transfer gates being coupled between each pair of bit lines and said pair of bus lines, an input data buffer circuit for operatively supplying sid pair of bus lines with input data in a write mode, an output circuit coupled to said pair of bus lines for outputting a read signal in a read mode, a bit line selection circuit for operatively enabling one pair of transfer gates thereby to transfer data at said pair of bus lines to a selected pair of bit lines through the enabled pair of transfer gates in the write mode and transfer data at the selected pair of bit lines to the pair of bus lines through the enabled pair of transfer gates in the read mode, means for generating a first control signal when a first period of time has elapsed from the initiation of an access cycle in the read mode and the write mode, means for generating a second control signal when a second period of time has elapsed from said initiation of the access cycle only in the write mode, said second period being shorter than said first period, means responsive to said second control signal for enabling said input data buffer circuit, and a column control circuit for enabling said bit line selection circuit in response to said first control signal in the read mode and in response to said second control signal in the write mode, whereby the selection of the transfer gates is achieved with a shorter delay time from the initiation of access cycle in the write mode than in the read mode.

2. The memory circuit according to claim 1, in which said column control circuit includes a column decoder, a first NOR gate receiving said first and second control signals, and a second NOR gate receiving the outputs of said column decoder and said first NOR gate.

3. The memory circuit according to claim 1, further comprising a sense amplifier provided for each pair of bit lines and means for enabling said sense amplifier only in the read mode.

4. A memory circuit comprising a plurality of word lines, a plurality of bit lines defining columns of said memory, a plurality of memory cells each coupled to one of said word lines and one of said bit lines, a bus line, a plurality of transfer gates each coupled between each one of said bit lines and said bus line, an data input circuit for operatively supplying said bus line with input data in a write mode, a read circuit coupled to said bus line for operatively generating a read-out signal in response to data at said bus line in a read mode, selection means coupled to said plurality of transfer gates for operatively enabling one of said transfer gates thereby to transfer data at said bus line through the enabled transfer gate to a selected bit line in the write mode and to transfer data at a selected bit line to said bus line through the enabled transfer gate in the read mode, means for generating a first control signal when a first period of time has elapsed from an initiation of an access cycle in the read mode and the write mode, means for generating a second control signal when a second period of time has elapsed from the initiation of the access cycle only in the write mode, means responsive to said second control signal for enabling said data input circuit, and a control circuit for enabling said selection means in response to said first control signal in the read mode and in response to said second control signal in the write mode, whereby the selection of said transfer gates is achieved with a shorter delay time from the initiation of access cycle in the write mode than in the read mode.

5. The memory circuit according to claim 4, in which said control circuit includes a column decoder, a first NOR gate receiving said first and second control signals, and a second NOR gate receiving the outputs of said column decoder and said first NOR gate.

6. The memory circuit according to claim 4, in which each of said memory cells is of a static type.

7. The memory circuit according to claim 4, further comprising a sense amplifier provided for each column and means for enabling said sense amplifier only in a read operation.

* * * * *

UNITED STATES PATENT AND TRADEMARK OFFICE
CERTIFICATE OF CORRECTION

PATENT NO. : 4,768,168
DATED : August 30, 1988
INVENTOR(S) : Watanabe

It is certified that error appears in the above-identified patent and that said Letters Patent is hereby corrected as shown below:

COLUMN 2, LINE 44     Delete "$\overline{DB1}$" insert --DB1--;

Delete "DG1" insert --$\overline{DG1}$--.

COLUMN 2, LINE 52     Delete "$Y_{j1}$" and insert --$\overline{Y_{ji}}$--;

COLUMN 2, LINE 53     Delete "but" insert --bus--;

COLUMN 3, LINE 29     Delete "DB1" and insert --$\overline{DB1}$--;

COLUMN 3, LINE 56     Delete "$\phi hd\ WE1$" insert --$\phi_{WE1}$--;

COLUMN 3, LINE 66     Delete "$a_{WE1}$" insert --$\phi_{WE1}$--;

COLUMN 3, LINE 67     Delete "$a_{jWE}$" insert --$\phi_{jWE1}$--

Signed and Sealed this

Twenty-first Day of February, 1989

*Attest:*

DONALD J. QUIGG

*Attesting Officer*     *Commissioner of Patents and Trademarks*